United States Patent
Lee

(10) Patent No.: US 6,842,384 B2
(45) Date of Patent: Jan. 11, 2005

(54) NONVOLATILE SEMICONDUCTOR MEMORY WITH POWER-UP READ MODE

(75) Inventor: Seung-Keun Lee, Kyunggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 162 days.

(21) Appl. No.: 10/355,401

(22) Filed: Jan. 31, 2003

(65) Prior Publication Data

US 2003/0147287 A1 Aug. 7, 2003

(30) Foreign Application Priority Data

Feb. 2, 2002 (KR) .......................................... 2002-6043

(51) Int. Cl.[7] ................................................ G11C 7/00
(52) U.S. Cl. ............................ 365/189.09; 365/189.01; 365/230.06
(58) Field of Search ...................... 365/189.09, 230.06, 365/189.01, 185.21, 230.03, 233, 241, 191

(56) References Cited

U.S. PATENT DOCUMENTS

| | | | |
|---|---|---|---|
| 6,347,064 B1 * | 2/2002 | Seo | 365/233 |
| 2002/0067633 A1 * | 6/2002 | Ito et al. | 365/94 |
| 2004/0001379 A1 * | 1/2004 | Azuma | 365/202 |

* cited by examiner

*Primary Examiner*—Richard Elms
*Assistant Examiner*—Dang T Nguyen
(74) *Attorney, Agent, or Firm*—Marger Johnson & McCollom

(57) ABSTRACT

A nonvolatile semiconductor memory device executing an automatic read operation at the time of a power-up is disclosed. For the automatic read operation, it starts to generate a wordline voltage when a power supply voltage at a power-up time reaches a first voltage. When the wordline voltage is charged up to a desired voltage level, a read operation begins automatically.

22 Claims, 5 Drawing Sheets

NONVOLATILE SEMICONDUCTOR MEMORY WITH POWER-UP READ MODE

This application claims priority from Korean Patent Application No. 2002-6043, filed on Feb. 2, 2002, the contents of which are herein incorporated by reference in their entirety for all purposes.

FIELD OF THE INVENTION

This disclosure generally relates to semiconductor memory devices and more specifically to nonvolatile semiconductor memory devices.

BACKGROUND OF THE INVENTION

Semiconductor memory devices are generally classified into volatile devices, such as SRAMs or DRAMs, and nonvolatile devices, such as mask-ROMs or flash memories. Nonvolatile memories, because they store data even when no power is applied, can be read during the time operating voltages are initially applied to the memory (i.e., during a "power-up.") Volatile memories, conversely, must precede read operations with write operations at power-up times because they cannot store data without having power applied. Thus, at power-up, no valid data exists in a volatile memory device. Such a read operation for nonvolatile memories during a power-up is referred to "a power-up read operation" hereinafter.

The power-up read operation requires a minimum wordline voltage before it can be performed. A power-up read operation performed before having an adequate wordline voltage will be inoperative, or will generate invalid data. One reason for this is because, if the wordline voltage is below the desired level, a sensing operation is carried out with the lower wordline voltage and a memory cell (e.g., an on-cell) coupled to the wordline voltage that is conditioned with a smaller channel current, resulting in a read failure for an on-cell.

SUMMARY OF THE INVENTION

Embodiments of the present invention provide a nonvolatile semiconductor memory that can provide stable power-up read operation. The read operation is operative in synchronously response to a transition of an external address after the power-up.

The foregoing features and advantages of the invention will be more fully described in the accompanying drawings.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components.

DESCRIPTION OF THE PREFERRED EMBODIMENTS

In the following description for purposes of explanation, specific numbers, materials and configurations are set forth in order to provide a thorough understanding of the present invention. However, it will be apparent to one skilled in the art that the present invention may be practiced without the specific details. In other instances, well-known systems are shown in diagrammatic or block diagram form in order not to obscure the present invention.

Figure 1:
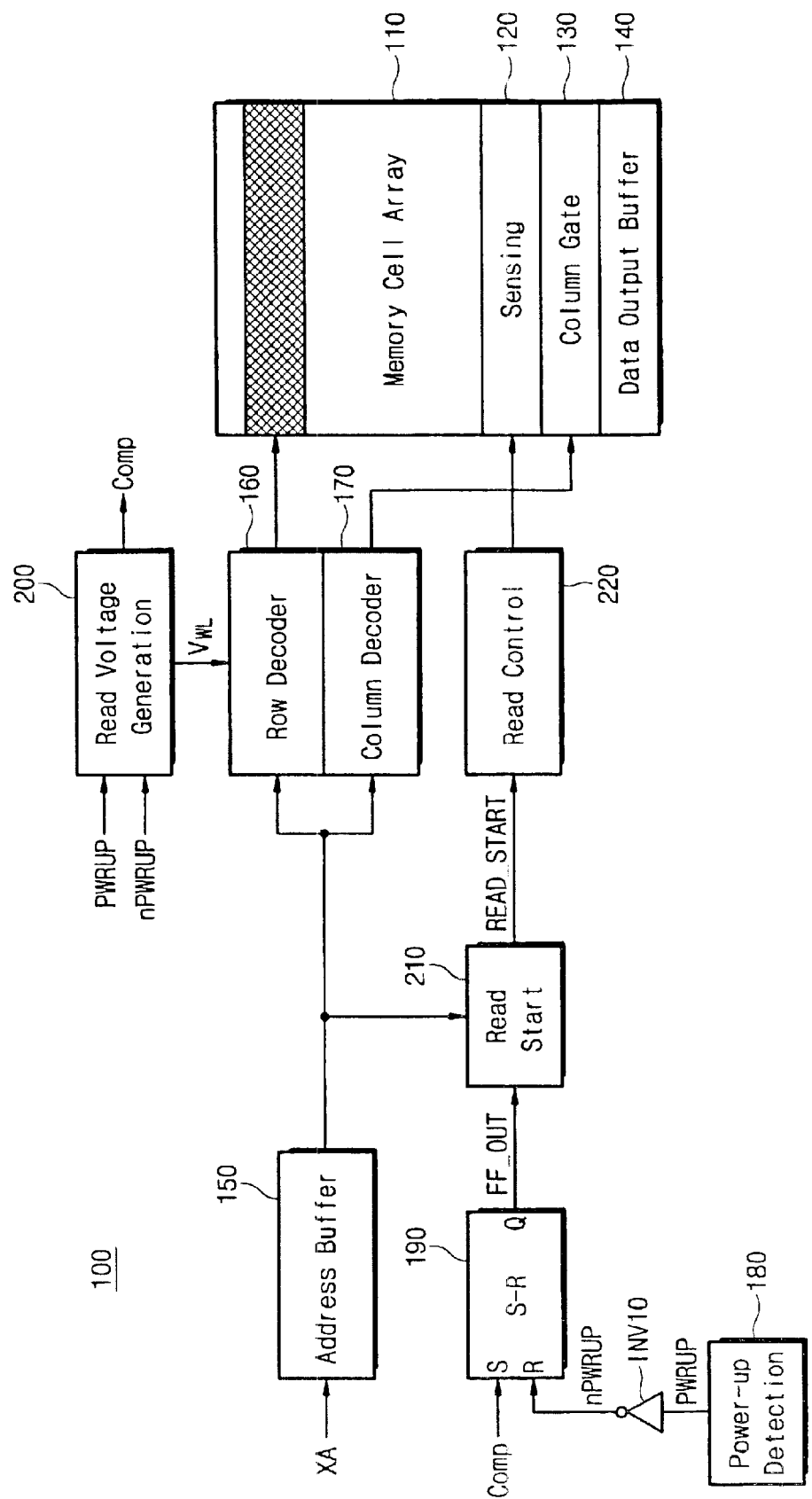
FIG. 1 is a block diagram of a nonvolatile semiconductor memory device according to an embodiment of the invention.

FIG. 1 shows a functional construction of a nonvolatile memory 100 according to an embodiment of the invention. The nonvolatile memory 100 could be a kind of asynchronous memory used to bootstrap a computer system, such as a NOR flash memory, a masked ROM, or a ferroelectric memory, for example. Referring to FIG. 1, the nonvolatile memory 100 includes a memory cell array 110, a sensing circuit 120, a column gate circuit 130, data output buffer 140, an address buffer 150, a row decoder 160, a column decoder 170, a power-up detector 180, an inverter INV10, a S-R flipflop 190, a read voltage generator 200, a read start circuit 210, and a read controller 220. Read circuitry includes the sensing circuit 120, the column gate circuit 130, the row decoder 160, and the column decoder 170, used in conjunction to read data out of the memory cell array 110.

The memory cell array 110 is constructed of a number of memory cells arranged on wordlines (or rows) and bitlines (or columns). Each individual memory cell could be, for example, electrically erasable and programmable NOR flash memory cell, a masked ROM cells fabricated by an ion implantation, or a ferroelectric memory cell that is electrically programmable. With the NOR flash memory cells or the masked ROM cells, the sensing circuit 120 detects data from the memory cells arranged on cross sections. The sensed data is transferred to the data output buffer 130. While with the ferroelectric memory cells, the sensing circuit 120 detects data from memory cells of a row selected by the row decoder 160 and then the detected data ise transferred to the data output buffer 140 through the column gate circuit 130 operative by the column decoder 170. A row address from the address buffer 150 is provided to the row decoder 160 while a column address from the address buffer 150 is applied to the column decoder 170.

Figure 2:
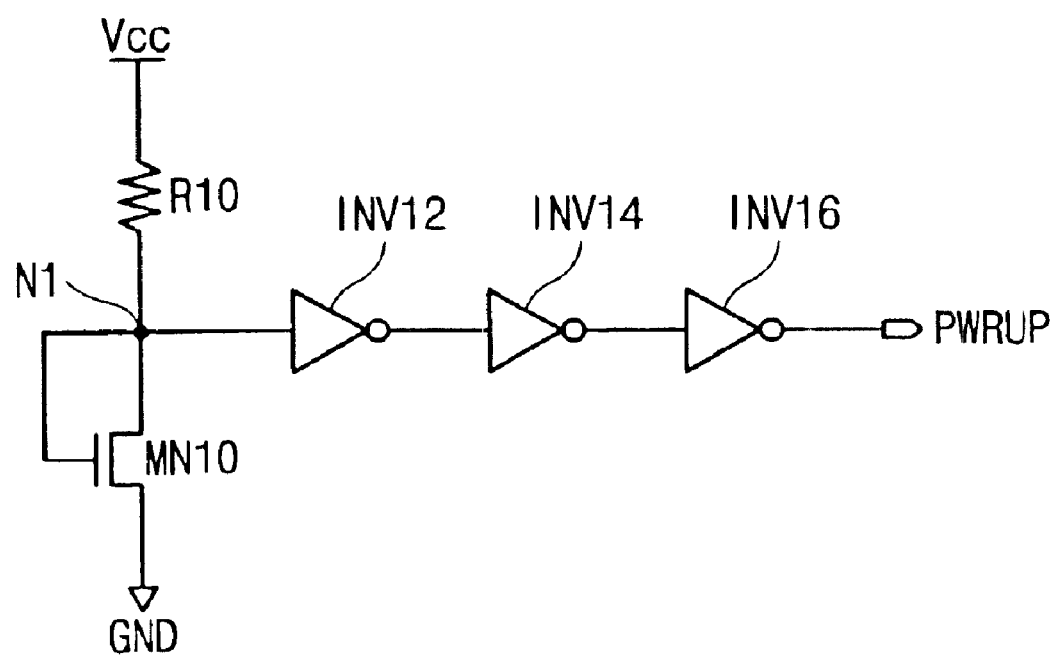
FIG. 2 is a circuit diagram of a power-up detector that can be used in the memory device shown in FIG. 1.

The power-up detector 180 (FIG. 2) generates a power-up detection signal PWRUP when a power supply voltage Vcc is higher than a predetermined voltage $V_{DET}$. The power-up detection signal PWRUP is at a low level when the power supply voltage Vcc is lower than the predetermined voltage $V_{DET}$, and at a high level when Vcc is higher than $V_{DET}$. The power-up detector 180, referring to FIG. 2, is formed of a resistor R10, an NMOS transistor MN10, and inverters INV12, INV14 and INV16. The resistor R10 is connected between Vcc and a node N1 and the NMOS transistor MN10 is connected between the node N1 and a ground voltage GND. A gate of the NMOS transistor MN10 is also coupled to the node N1. The inverters INV12, INV14, and INV16 are connected in series from the node N1 to an output terminal of the power-up detection signal PWRUP. At the time of power-up, a voltage of the node N1 increases along with an initial rise of the power supply voltage Vcc. The power-up detection signal PWRUP is held at a low level during a turn-off state of the NMOS transistor MN10. Then, when the N1 voltage rises up enough to turn the NMOS transistor MN10 on, the power-up detection signal PWRUP goes to a high level.

Figure 3:
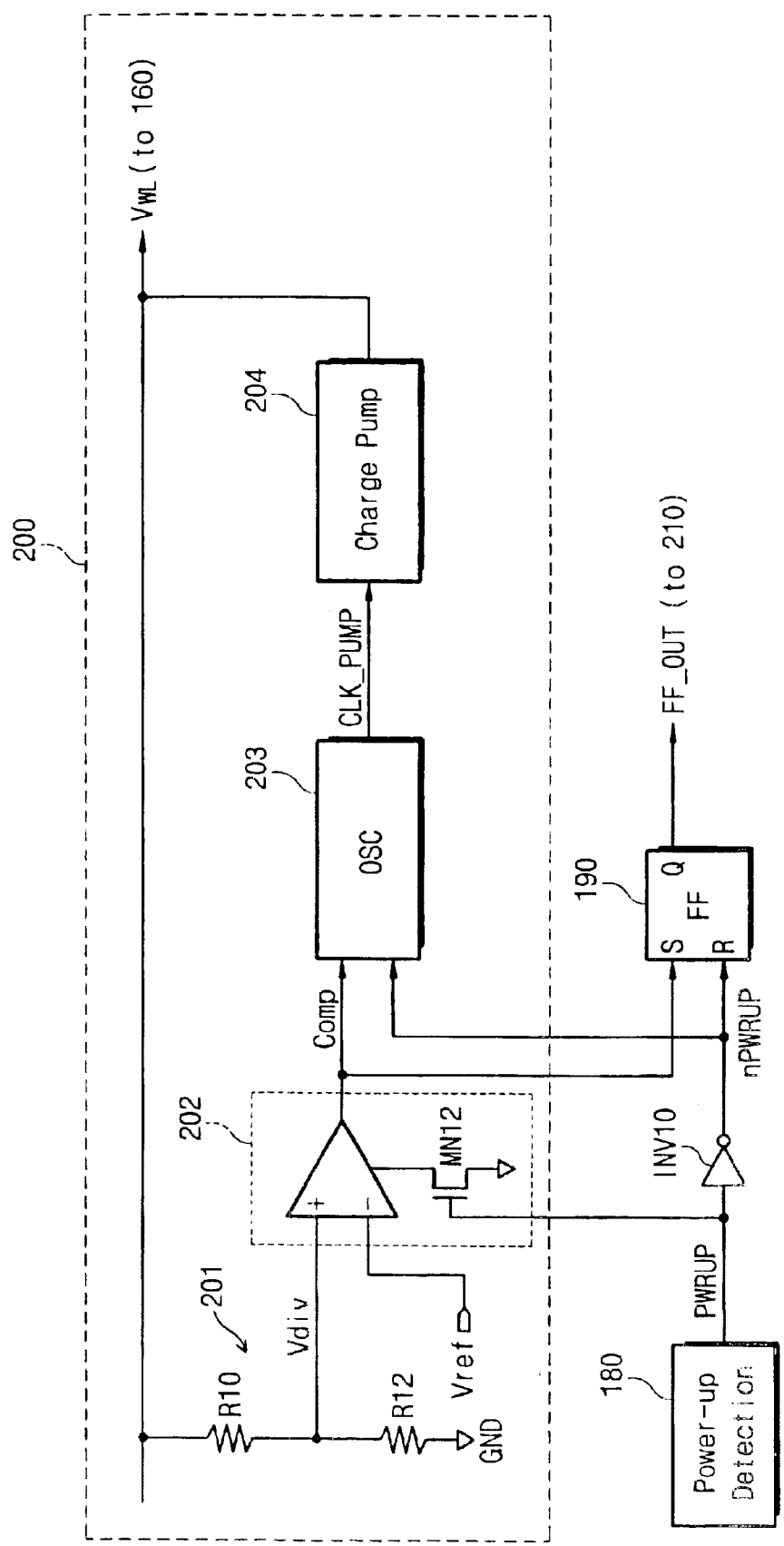
FIG. 3 is a circuit diagram of a read voltage generator that can be used in the memory device shown in FIG. 1.

The S-R flipflop 190, referring to FIG. 3, is reset by a reverse power-up detection signal nPWRUP provided from the inverter INV10 and the S-R flipflop's 190 output signal FF_OUT results in a low level. When nPWUP switches to a high level from a low level, or when the power supply signal Vcc is under $V_{DET}$, the S-R flip-flop is reset thereby. A detection signal Comp supplied from the read voltage generator 200 sets the S-R flipflop 190 to make the output signal FF_OUT a high level, for which the reverse power-up detection signal nPWRUP is pulled to a low level from a high level when the power supply voltage Vcc rises above $V_{DET}$.

The read voltage generator 200 begins generating a read voltage (or a wordline voltage) $V_{WL}$ when the power-up detection signal PWRUP is activated to a high level and terminates the generation of $V_{WL}$ when $V_{WL}$ reaches a desired voltage level (or a target voltage level). If the read voltage $V_{WL}$ falls below the desired voltage level, the read voltage generator 200 resumes its output of the read voltage $V_{WL}$. The detection signal Comp, informing of whether the read voltage $V_{WL}$ is higher than the desired voltage level, is used as a setup signal for the S-R flipflop 190. When the detection signal Comp first goes to a high level from a low level, the output signal FF_OUT of the S-R flipflop 190 also goes to a high level from a low level. The high-leveled output signal FF_OUT is retained until the power supply voltage Vcc is shut off or becomes lower than $V_{DET}$.

The read start circuit 210 (FIG. 1) generates a read start signal RS in response to the S-R flipflop output signal FF_OUT and an output signal of the address buffer 150. The read start signal READ_START is active with a high-level pulse when: the output signal FF_OUT is set on a high level; the read voltage $V_{WL}$ reaches the desired voltage level at the power-up time; or an output signal of the address buffer 150 changes for transition, which means a read operation begins synchronously responding to an input of external address after a power-up reading. The read controller 220 causes the sensing circuit 120 to perform a stable read operation after the power-up, in response to the read start signal READ_START As shown in FIG. 3, the read voltage generator 200 is constructed of a voltage divider 201, a comparator 202, an oscillator 203, and a charge pump 204. The voltage divider 201 determines a divided voltage Vdiv from the read voltage $V_{WL}$ by means of resistors R11 and R12 connected between $V_{WL}$ and GND in series. The comparator 202 is conductive only when the power-up detection signal PWRUP is active in a high level, generating the detection signal Comp arising from comparing the divided voltage Vdiv with a reference voltage Vref. The detection signal Comp becomes a low level when Vdiv is lower than Vref, while Comp is a high level when Vdiv is higher than Vref. The high-leveled Comp sets the S-R flipflop 190.

Figure 4:
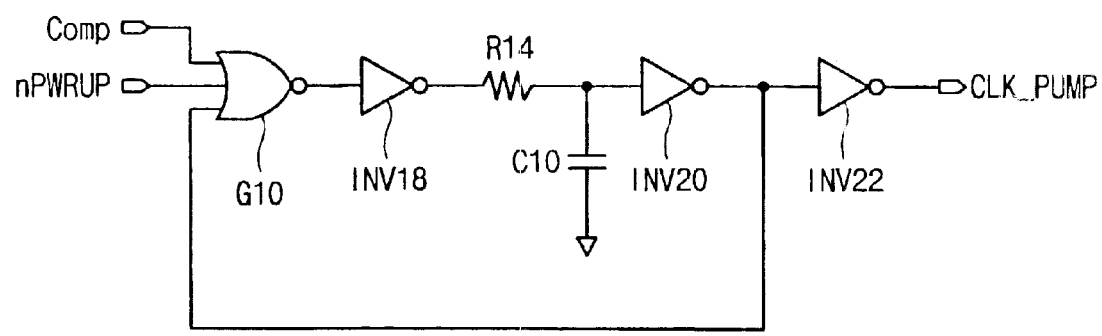
FIG. 4 is a circuit diagram of an oscillator that can be used with the read voltage generator shown in FIG. 3.

As shown in FIG. 4, the oscillator 203 creates a clock signal CLK_PUMP in response to the signals Comp and nPWRUP, including a NOR gate G10, an inverter INV18, a resistor R14, a capacitor C10, and inverters INV20 and INV22. The clock signal CLK_PUMP is not generated from the oscillator 203 when the power supply voltage Vcc is lower than the detection voltage $V_{DET}$ or the divided voltage Vdiv is higher than the reference voltage Vref, while actively generated when Vcc is higher than $V_{DET}$ (e.g., 2.3V in about 3.3V of Vcc) and Vdiv is lower than Vref.

Figure 5:
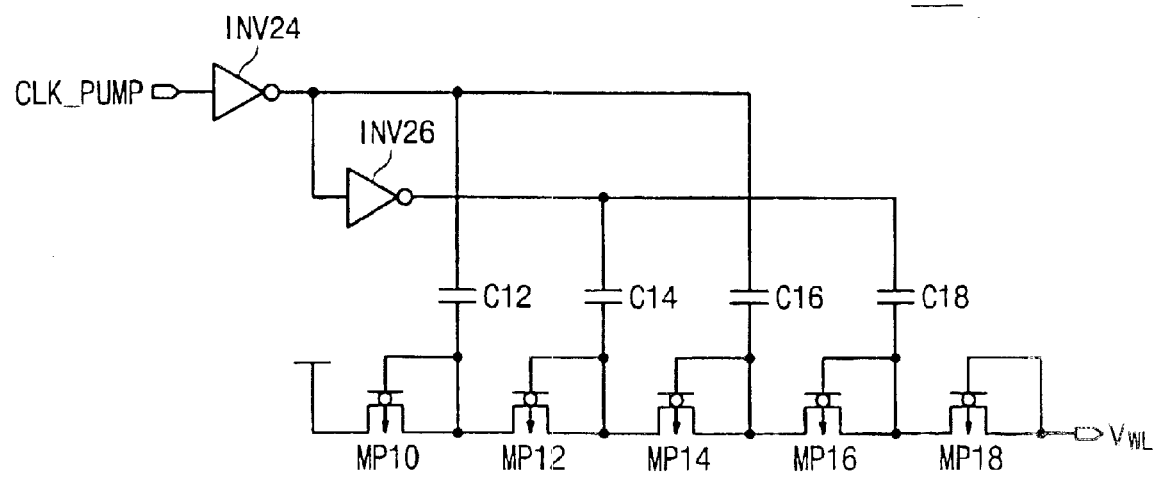
FIG. 5 is a circuit diagram of a charge pump that can be used in the oscillator in FIG. 4.

As illustrated in FIG. 5, the charge pump 204 generates the read voltage $V_{WL}$ in response to the clock signal CLK_PUMP provided from the oscillator 203. The charge pump 204 includes inverters INV24 and INV26, capacitors C12, C14, C16, and C18, and PMOS transistors MP10, MP12, MP14, MP16, and MP18, as shown in FIG. 5. The read voltage $V_{WL}$ is preliminarily charged up to the Vcc level before being bootstrapped to its operable voltage level.

Figure 6:
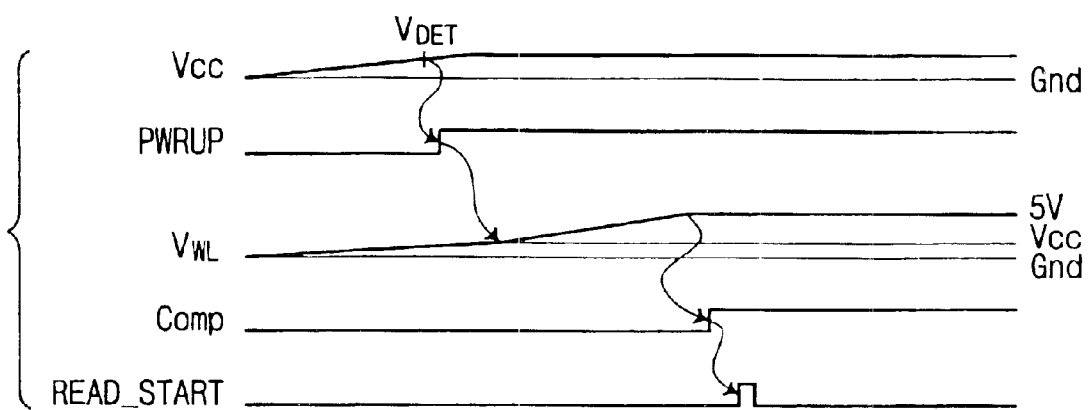
FIG. 6 is a timing diagram of a power-up read operation that can be performed by the memory device of FIG. 1.

FIG. 6 shows a timing flow of a power-up read operation in a nonvolatile semiconductor memory presented by embodiments of this invention. With a gradual increase of the power supply voltage Vcc (used in a system embedding the present nonvolatile semiconductor memory), the power-up detector 180 finds the power supply voltage Vcc reaches the predetermined detection voltage VDET. If the power supply voltage Vcc is lower than $V_{DET}$, the power-up detection signal PWRUP is established at a low level to reset the S-R flipflop 190 by means of a high-leveled nPWRUP output from the inverter INV10.

When the power supply voltage Vcc reaches the predetermined detection voltage $V_{DET}$, the power-up detection signal PWRUP goes to a high level. Then, the NMOS transistor MN12 (FIG. 3) is turned on by the high-leveled power-up detection signal PWRUP to comparing the divided voltage Vdiv with the reference voltage Vref. Since the read voltage $V_{WL}$ is below the desired voltage level (e.g., 5V) at the time of power-up, the oscillator 203 generates the clock signal CLK_PUMP to drive the charge pump 204.

When the read voltage $V_{WL}$, which is increasing from an output of the charge pump 204, reaches the desired voltage, i.e., Vdiv becomes greater than Vref, the detection signal Comp goes up to a high level from a low level. During this, the output signal FF_OUT of the S-R flipflop 190 also goes up to a high level from a low level. The read start circuit 210 (FIG. 1) generates the read start signal READ_START having a high-leveled, short pulse in response to the rising of the output signal FF_OUT.

The read controller 220 responds to the read start signal READ_START to conduct the power-up read operation. Before the power supply voltage Vcc reaches the desired voltage level, an initial address is applied to the memory externally from a system host. The external address XA is transferred to the row and column decoders 160 and 170 by way of the address buffer 150, as shown in FIG. 1. The row and column decoders 160 and 170 designate memory cells in accordance with the received address. Data stored in the selected memory cells is detected by the sensing circuit 120 and then transferred to the data output buffer 140 through the column gate circuit 130. After this, the data latched in the data output buffer 140 is output from the memory chip in response to an output enable signal.

While this embodiment uses an external address provided from a system host (e.g., a system controller such as CPU), it is possible to prepare an address for carrying out the power-up read operation. For instance, controlling the address buffer 150 with the power-up detection signal PWRUP of the power-up detector 180 can generate the initial address.

Specific examples of memory devices including embodiments of the invention can include: a memory cell array of memory cells arranged in a matrix of rows and columns; a voltage detector for activating a first detection signal when a power supply voltage reaches a first detection voltage at a time of power-up; a read voltage generator for creating a read voltage in response to the first detection signal and for activating a second detection signal when the read voltage reaches a second detection voltage; a read start signal for generating a read start signal in response to an activation of the second detection signal; and read circuitry for reading data from the memory cell array in response to the read start signal.

The first detection voltage is lower than the power supply voltage. The memory can be used as a bootstrapping memory in a computer system. The memory can be an asynchronous memory, and either a NOR-type flash memory or a masked ROM, for instance.

In another aspect of this invention, a nonvolatile semiconductor memory includes: a memory cell array of memory cells arranged in a matrix of rows and columns; a first voltage detector for activating a first detection signal when a power supply voltage reaches a first detection voltage at a time of power-up; a read voltage generator for creating a read voltage in response to the first detection signal and for activating a second detection signal when the read voltage reaches a second detection voltage; a row decoder for selecting one of the rows in response to a row address and for transferring the read voltage to the selected row; a column decoder for selecting a part of the columns in response to column addresses; a read start signal for generating a read start signal in response to an activation of the second detection signal; a sensing circuit for reading data from the memory cells designated by the selected rows and columns; and a read controller for operating the sensing circuit in response to the read start signal.

In further aspects of the invention, a nonvolatile semiconductor memory operable in a power-up read mode includes: a memory cell array of memory cells arranged in a matrix of rows and columns; a first voltage detector for activating a first detection signal when a power supply voltage reaches a first detection voltage at a time of power-up; an address buffer for receiving an external address; a read voltage generator for creating a read voltage in response to the first detection signal and for activating a second detection signal when the read voltage reaches a second detection voltage; a row decoder for selecting one of the rows in response to a row address among the external address and for transferring the read voltage to the selected row; a column decoder for selecting a part of the columns in response to column addresses among the external address; a sensing circuit for reading data from memory cells designated by the selected row and columns; a flipflop reset by the first detection signal and set by the second selection signal; a read start signal for generating a read start signal when the flipflop is set by an activation of the second detection signal; and a read controller for operating the sensing circuit in response to the read start signal.

The read voltage generator can include an oscillator for generating a clock signal in response to the first and second detection signals; and a charge pump for generating the read voltage in response to the clock signal; wherein the second detection signal is made from comparing a reference voltage with a voltage divided from the read voltage under an activation state of the first detection signal. After the power supply voltage reaches a target voltage the read start circuit generates the read start signal whenever an output of the address buffer changes with transition.

Also, according to embodiments of this invention, a method for power-up reading in a nonvolatile memory can include activating a first detection signal when a power supply voltage reaches a first detection voltage at a time of power-up; generating a wordline voltage in response to an activation of the first detection signal; detecting when the wordline voltage reaches a second detection voltage; and conducting a read operation for the memory when the wordline voltage reaches the second detection voltage.

With respect to the aforementioned description and the referred drawings, since a power-up read operation is activated after verifying whether a read voltage (or a wordline voltage) reaches a desired voltage level, being prevented from its proceeding under a lower read voltage, it provides a stable power-up read operation without malfunctions thereof.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A nonvolatile semiconductor memory comprising:
   an array of memory cells arranged in a matrix of rows and columns;
   a voltage detector for activating a first detection signal when a power supply voltage reaches a first detection voltage during a power-up phase;
   a read voltage generator for creating a read voltage in response to the first detection signal and for activating a second detection signal when the read voltage reaches a second detection voltage;
   a read start signal generator for generating a read start signal in response to an activation of the second detection signal; and
   read circuitry for reading data from the memory cell array in response to the read start signal.

2. The memory according to claim 1, wherein the first detection voltage is lower than a standard power supply voltage.

3. The memory according to claim 1, wherein the memory is a bootstrapping memory.

4. The memory according to claim 1, wherein the memory is an asynchronous memory.

5. The memory according to claim 4, wherein the asynchronous memory is a NOR-type flash memory.

6. The memory according to claim 4, wherein the asynchronous memory is a masked ROM.

7. A nonvolatile semiconductor memory comprising:
   an array of memory cells arranged in a matrix of rows and columns;
   a first voltage detector for activating a first detection signal when a power supply voltage reaches a first detection voltage at a power-up time;
   a read voltage generator for creating a read voltage in response to the first detection signal and for activating a second detection signal when the read voltage reaches a second detection voltage;
   a row decoder for selecting one of the rows in response to a row address, and for transferring the read voltage to the selected row;
   a column decoder for selecting a part of the columns in response to column addresses;
   a read start signal generator for generating a read start signal in response to an activation of the second detection signal;
   a sensing circuit for reading data from the memory cells designated by the selected rows and columns; and
   a read controller for operating the sensing circuit in response to the read start signal.

8. The memory according to claim 7, wherein the first detection voltage is lower than standard power supply voltage.

9. The memory according to claim 7, wherein the memory is a bootstrapping memory.

10. The memory according to claim 7, wherein the memory is an asynchronous memory.

11. The memory according to claim 10, wherein the asynchronous memory is a NOR-type flash memory.

12. The memory according to claim 10, wherein asynchronous memory is a masked ROM.

13. The memory according to claim 7, wherein the row and column addresses are supplied from a source external to the memory.

14. A nonvolatile semiconductor memory operable in a power-up read mode, comprising:

an array of memory cells arranged in a matrix of rows and columns;

a first voltage detector for activating a first detection signal when a power supply voltage reaches a first detection voltage in a power-up phase;

an address buffer for receiving an external address;

a read voltage generator for creating a read voltage in response to the first detection signal and for activating a second detection signal when the read voltage reaches a second detection voltage;

a row decoder for selecting one of the rows in response to a row address among the external address and for transferring the read voltage to the selected row;

a column decoder for selecting a part of the columns in response to column addresses among the external address;

a sensing circuit for reading data from memory cells designated by the selected row and columns;

a flipflop structured to be reset by the first detection signal and set by the second selection signal;

a read start signal generator for generating a read start signal when the flipflop is set by an activation of the second detection signal; and a read controller for operating the sensing circuit in response to the read start signal.

15. The memory according to claim 14, wherein the first detection voltage is lower than the power supply voltage.

16. The memory according to claim 14, wherein the memory is used as a bootstrapping memory.

17. The memory according to claim 14, wherein the read voltage generator comprises:

an oscillator for generating a clock signal in response to the first and second detection signals; and a charge pump for generating the read voltage in response to the clock signal.

18. The memory of claim 14, wherein the second detection signal is made after comparing a reference voltage to a voltage divided from the read voltage under an activation state of the first detection signal.

19. The memory according to claim 14, wherein the memory is an asynchronous memory.

20. The memory according to claim 14, wherein the read start circuit generator is structured to generate the read start signal whenever an output of the address buffer changes with transition, after the power supply voltage reaches a target value.

21. A method for power-up reading in a nonvolatile memory, the method comprising:

activating a first detection signal when a power supply voltage reaches a first detection voltage in a power-up phase;

generating a wordline voltage in response to an activation of the first detection signal;

determining when the wordline voltage reaches a second detection voltage; and conducting a read operation for the memory when the wordline voltage reaches the second detection voltage.

22. The method according to claim 21, wherein the read operation is operative in synchronously response to a transition of an external address after the power-up phase.

* * * * *

UNITED STATES PATENT AND TRADEMARK OFFICE
CERTIFICATE OF CORRECTION

PATENT NO.     : 6,842,384 B2
DATED          : January 11, 2005
INVENTOR(S)    : Lee It is certified that error appears in the above-identified patent and that said Letters Patent is hereby corrected as shown below:

Column 3,
Line 8, replace "When nPWUP switches" with -- When nPWRUP switches --.

Signed and Sealed this

Twenty-seventh Day of December, 2005

JON W. DUDAS
*Director of the United States Patent and Trademark Office*